United States Patent
Yang et al.

(10) Patent No.: US 6,798,372 B1
(45) Date of Patent: Sep. 28, 2004

(54) SWITCHED-CAPACITOR FREQUENCY-TO-CURRENT CONVERTER

(75) Inventors: Yaohua Yang, Hillsboro, OR (US); Ruoxin Jiang, Hillsboro, OR (US); Rumin Yin, Hillsboro, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/405,191

(22) Filed: Apr. 1, 2003

(51) Int. Cl.[7] .............................................. H03M 1/60
(52) U.S. Cl. ...................................... 341/157; 341/158
(58) Field of Search ................................. 341/157, 158

(56) References Cited

U.S. PATENT DOCUMENTS 5,457,458 A * 10/1995 Saxon ......................... 341/157

* cited by examiner

Primary Examiner—Brian Young
(74) Attorney, Agent, or Firm—Perkins Coie LLP

(57) ABSTRACT

A frequency-to-current converter operative to convert a clock frequency to an output current is described; the frequency-to-current converter ensures that the output current increases linearly with the clock frequency. The frequency-to-current converter may be incorporated in analog-to-digital converters driven by clocks with variable frequencies. The frequency-to-current converter employs an integrator circuit, used to compare an input reference voltage and a current feedback into a sampling capacitor. At steady state, the feedback current is just sufficient to discharge the sampling capacitor to a fixed voltage. The core of the frequency-to-current conversion circuit includes one opamp, two capacitors, one feedback transistor and a few switches.

36 Claims, 4 Drawing Sheets

SWITCHED-CAPACITOR FREQUENCY-TO-CURRENT CONVERTER

FIELD OF THE INVENTION

The invention relates to the field of electronics, and more specifically to circuits for frequency to current conversion.

DESCRIPTION OF RELATED ART

Frequency-to-voltage and frequency-to-current converters are employed in numerous types of applications. One such application is the field of analog-to-digital conversion, in which power consumption by analog-digital processors is a persistent and increasingly complicated issue. Applications such as Analog-to-Digital converters (ADCs), require features such as an adaptive bias current, which enable analog-to-digital conversion while saving power consumption. Tools such as a frequency-to-current converter may be employed in such applications to supply an adaptive bias current.

Standard implementations of frequency-to-current converters, however, are inadequate to such tasks. Frequency-to-current converters are often implemented by coupling a frequency-to-voltage converter to a voltage-to-current converter. Many conventional frequency-to-voltage and voltage-to-current converters are well known in the art. This combination of circuits, however, is often inadequate for the purposes outlined above; in particular, such combinations are complicated to be embedded in a single integrated circuit, and demand too much power for host applications, such as an ADC converter.

As such, there is a need for a frequency-to-current converter which is simple in implementation, and which ensures that a linear relationship is maintained between output current and input clock frequency, for suitability in host applications.

SUMMARY OF THE INVENTION

The invention comprises a frequency-to-current converter operative to convert a clock frequency to an output current, such that the output current increases linearly with the clock frequency. The frequency-to-current converter is designed to minimize power consumption in hardware applications. Examples of hardware applications which may incorporate the converter of the present invention include digital-to-analog converters (DAC) or analog-to-digital converters (ADC). These applications may be driven by clocks with variable frequencies.

In embodiments of the invention, the frequency-to-current converter employs an integrator circuit, which is used to compare an input reference voltage and a current feedback into a sampling capacitor. At steady state, the feedback current is just sufficient to discharge the sampling capacitor to a fixed voltage. Thus, the current only depends on the clock frequency, the sampling capacitor value and the reference voltage. The current is linearly proportional to each of the factors listed above.

In many applications employing the frequency-to-current converter-such as, by way of non-limiting example, the analog-to-digital converter—the clock frequency driving the circuit is variable. In one version of the analog-to-digital converter, the clock frequency may vary from 7.5 MHz to 22 MHz. In embodiments of the invention, the variable clock frequency is accommodated by biasing the amplifiers in the frequency-to-current converter with currents proportional to the clock frequency, thereby ensuring that the unity-gain bandwidth of the amplifiers is adaptively adjusted to track the clock frequency, and saving power concurrently.

Circuits employed by embodiments of the invention are simple in design, particularly by comparison to standard frequency-to-current converters. In embodiments of the invention, the core of the frequency-to-current conversion circuit includes one opamp, two capacitors, one feedback transistor and a few switches. The elegant design facilitates lower cost, complexity, and power consumption in the host application, and allows the frequency-to-current converter to be resident with the host application on a single integrated circuit. These and other embodiments are described in further detail infra.

DETAILED DESCRIPTION

Overview

The invention comprises a frequency-to-current converter operative to convert a clock frequency to an output current, such that the output current increases linearly with the clock frequency. In embodiments of the invention, the frequency-to-current converter uses an integrator to compare an input reference voltage and a current feedback into a sampling capacitor. At steady state, the feedback current is just enough to discharge the sampling capacitor to a fixed voltage. Thus, the current only depends on the clock frequency, the sampling capacitor value and the reference voltage.

This circuit employed is simple in design, particularly by comparison to standard frequency-to-current converters. In embodiments of the invention, the core of the frequency-to-current conversion circuit includes one opamp, two capacitors, one feedback transistor and a few switches. An output current of the frequency-to-current converter linearly increases with the clock frequency. The simplicity of the design facilitates lower cost, complexity, and power consumption in the host application.

The frequency-to-current converter is designed for use in applications such as an analog-to-digital converter, which are intended to operate at low power. As a non-limiting example, the frequency-to-current converter may be used to reduce power consumption in an analog-to-digital converter with a varying clock frequency. An illustrative, non-limiting example of such an analog-to-digital converter is the Max 1195 ™ ADC, produced by Maxim Integrated Products, Inc. of Sunnyvale, Calif. This ADC comprises a dual, 8-bit, ADC optimized for low power, operating at a 2.7 v to 3.6 v power supply, and which consumes 87 mW, and has a sampling rate of 40 Msps. By providing an adaptive bias current, the frequency-to-current converter ensures that the current in critical analog blocks in the analog-to-digital converter varies proportionally to a sample clock frequency.

The Frequency-to-Current Converter Circuit

Figure 1:
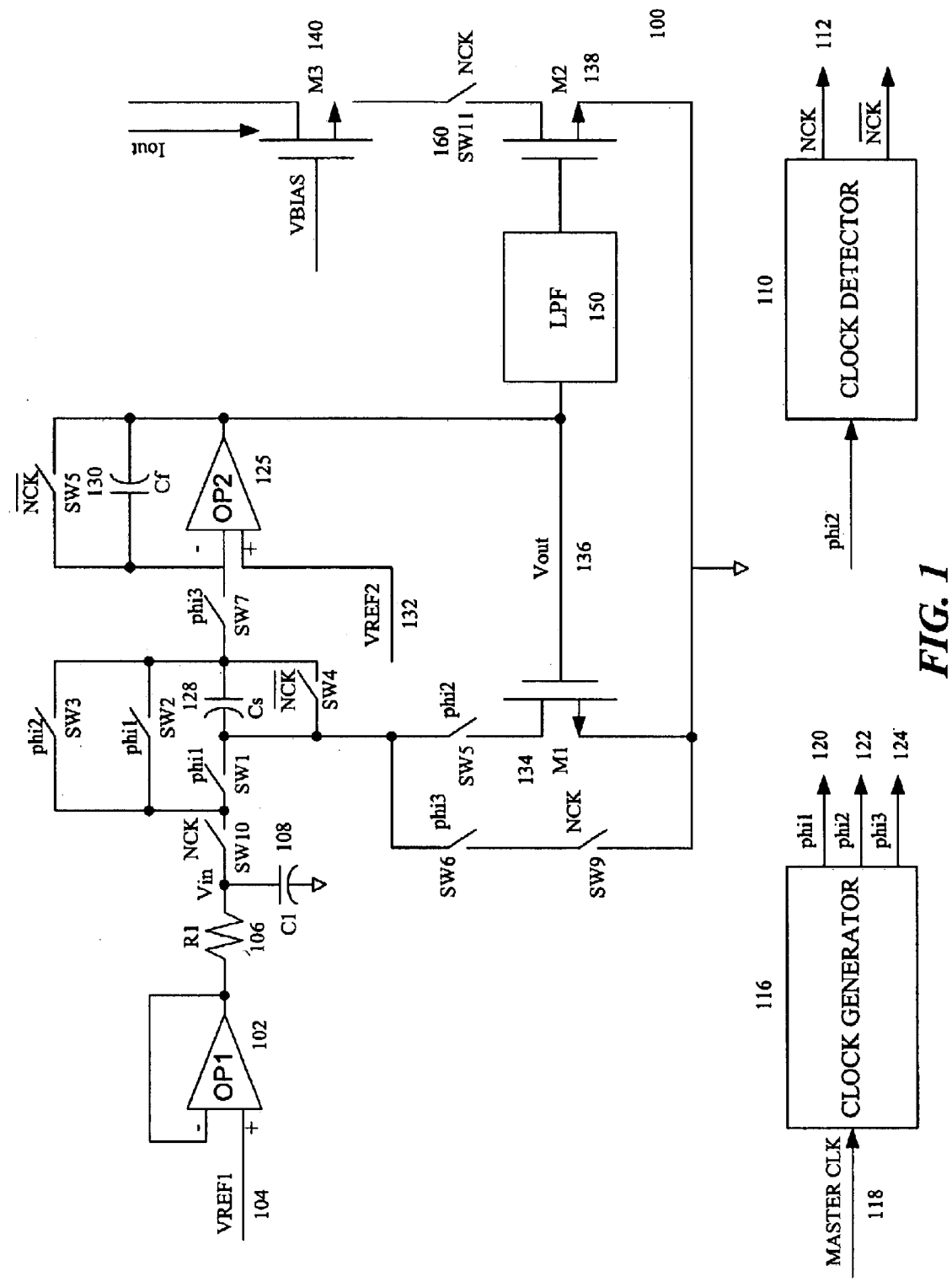
FIG. 1 schematically illustrates a circuit diagram for a frequency-to-current converter according to embodiments of the invention.

FIG. 1 schematically illustrates an example of a circuit 100 used to implement the frequency-to-current converter according to embodiments of the invention. The circuit 100 includes a first opamp op1 102, which receives a first reference voltage VREF1 104 at a positive input. The circuit further includes a sampling capacitor $C_s$ 128, and a feedback capacitor $C_f$ 130. The feedback capacitor $C_f$ 130 is operatively coupled to the negative input of a second opamp OP2 125. A second reference voltage $V_{ref2}$ 132 is operatively coupled to the positive input of the second op amp OP2 125. The circuit 100 further includes multiple switches, SW1, SW2, SW3, SW4, SW5, SW6, SW7, SW8, SW9, SW10, SW11, which are operated by clock pulses from a clock generator 116 coupled to a master clock 118; these clock pulses include phi1 120, phi2 122, phi3 124, NCK, and NCK bar, which are further described herein. The circuit also includes several MOSFET transistors M1 134, M2 138, M3 140.

In embodiments of the invention, the opamp op1 102 is used as a buffer for a first reference voltage, VREF1 104. A resistor $R_1$ 106 and a capacitor $C_1$ 108 are specifically used to relax the driving capability of the opamp op1 102. A clock detector 110 is used to turn off the frequency-to-current converter when a clock 114 stops. This ensures that the circuit 100 will not be biased at high current. When the clock detector 110 detects that the clock has stopped, the signal NCK 112 drops to a low state, and all switches in the circuit 100 which are controlled by NCK SW 10 SW9 are subsequently opened.

Figure 2:
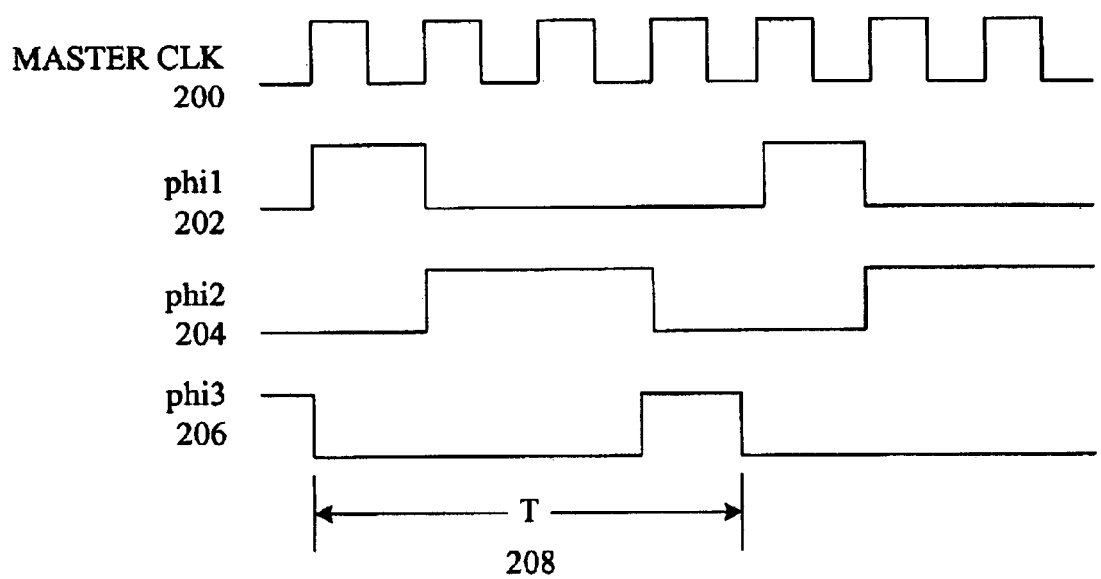
FIG. 2 illustrates a plurality of clock phases employed by the frequency-to-current converter according to embodiments of the invention.

A clock generator 116 is also illustrated in FIG. 1. The clock generator 116 receives input from a master clock MASTER CLK 118, and produces three timing waveforms, phi1 120, phi2 122, and phi3 124. FIG. 2 illustrates the clock timing of phi1 202, phi2 204, and phi3 206, relative to that of the master clock 200. Note that in the embodiments shown in FIG. 2, phi2 204 has a pulse width which is twice that of ph1 202 and phi3 206. The clock pulse phi3 206 has a period T 208 equal to four periods of the master clock MASTER CLK 200. These clock pulses operate various switches in the integrator circuit, as elaborated further herein.

Operation of the Integrator

With reference to FIG. 1, a second opamp op2 125, a sampling capacitor $C_s$ 128, and a feedback capacitor $C_f$ 130 comprise an integrator. The sampling capacitor $C_s$ 128 is coupled via a switch SW7 to the negative input of the second op amp OP2 125. The positive input of the second op amp 125 receives a second reference voltage VREF2 132. The feedback capacitor $C_f$ 130 forms a feedback to the second op amp OP2 125.

During the clock pulse phi1 120, the sampling capacitor Cs 128 is shorted. During the clock pulse phi2 122, the top plate of the sampling capacitor $C_s$ 128 is connected to the first reference voltage VREF1 104, and the bottom plate of the sampling capacitor $C_s$ 128 is discharged by a drain current of a transistor M1 130. At the end of the pulse phi2 122, the voltage across the sampling capacitor $C_s$ 128 is reduced to a voltage $V_x$. During the clock pulse phi3, the sampling capacitor $C_s$ 128 is connected to the negative input of the opamp op2 125. The opamp Op2 125 compares the voltage $V_x$ with the reference voltage VREF2 132 and adjusts the output Vout accordingly. At steady state, the voltage $V_x$ is identical to the reference voltage VREF2 132. The drain current of M1 134 is given by the relation Equation 1 below:

$$I = \frac{2C_s(VREF1 - VREF2)}{T} = \frac{C_s(VREF1 - VREF2)f_{master}}{2} \quad \text{Equation 1}$$

where $$T = \frac{4}{f_{master}}$$

and $f_{master}$ is the master clock frequency 200, as shown in FIG. 2.

Thus, per the relation given by Equation 1, the current I varies linearly with the frequency of the master clock, $f_{master}$ 200. The output voltage Vout 136 is low-pass filtered by a passive filter 150. The current of M1 134 is mirrored to M2 138. The transistors M2 138 and M3 140 form a high impedance current source, which can be used, in embodiments of the invention, to bias other circuitry in the respective application. Since the current is proportional to the clock frequency 200, the bandwidth (or the $g_m/C$) of the circuit 100 is proportional to the square root of the clock frequency 200. This implies that the circuit 100 saves power when the clock frequency 200 is low, and speeds up as the clock frequency 200 increases.

The stability of the frequency-to-current converter 100 depends on the clock frequency 200. If the voltage Vin on the top plate of the capacitor C1 108 is input and the output of the opamp op2 125 Vout is the output, the transfer function is given by Equation 2 below:

$$H(Z) = \frac{AZ^{-1/4}}{1 - (1-B)Z^{-1}} \quad \text{Equation 2}$$

where $A=C_s/C_f$, $B=g_{m1}*T/(2*C_f)$. $Z^{-1}$ corresponds to a delay of period T 208; in the illustrative example shown in FIG. 2, the period T comprises four periods of the master clock 200. The factor $g_{m1}$ represents the transconductance of M1 134, as shown in FIG. 1. Since the factor $g_{m1}$ is proportional to the square root of the current, $$I \alpha \sqrt{f}, B \alpha \frac{1}{\sqrt{f}}.$$

When the frequency 200 increases, the pole will asymptotically rise to Z=1 but will never reach Z=1. When the frequency 200 decreases and B>2, the pole will go outside the unity circle. This indicates the existence of a minimum clock frequency, below which the circuit will be unstable.

Figure 3:
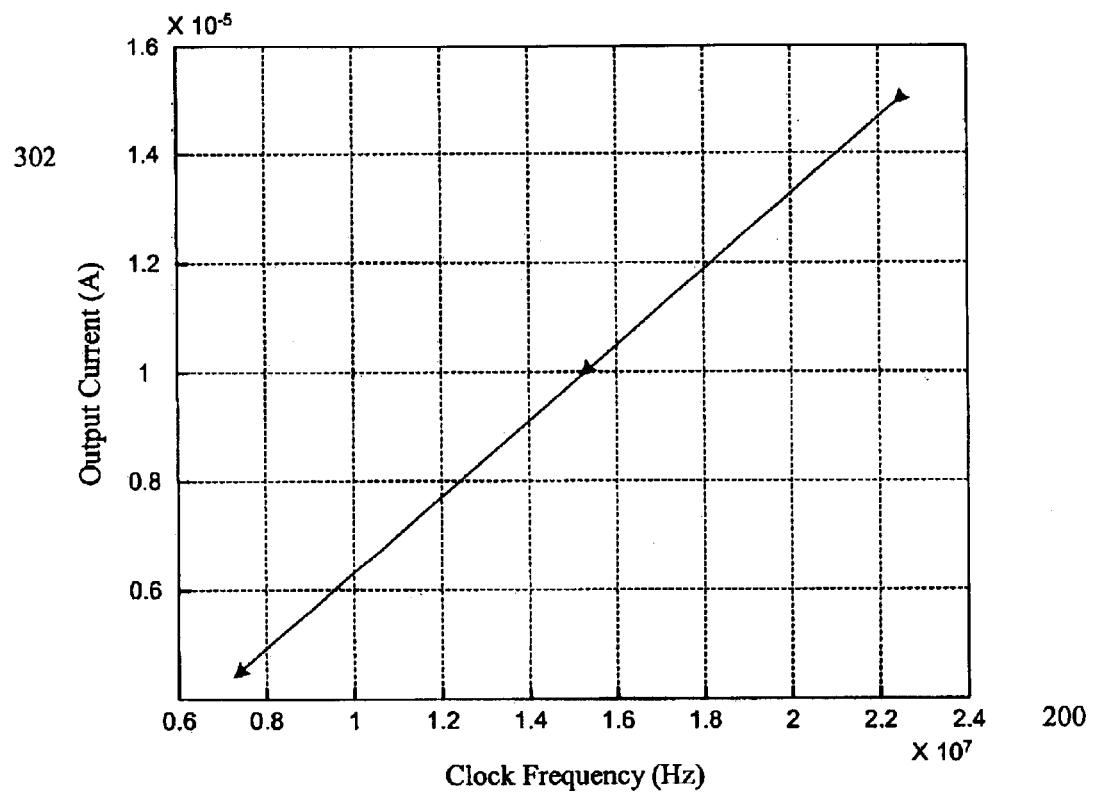
FIG. 3 illustrates a linear relationship between an input clock frequency of a frequency-to-current converter, and an output current of the frequency-to-current converter according to embodiments of the invention.

Simulations demonstrate that the frequency-to-current converter has a substantially linear relationship between the master clock frequency 200 and the output current. FIG. 3 illustrates the output current 302 as a function of the master clock frequency 200. In such embodiments, the non-linearity is within a threshold of 0.5% with a 3X frequency variation.

Clock Detection Circuit

Figure 4:
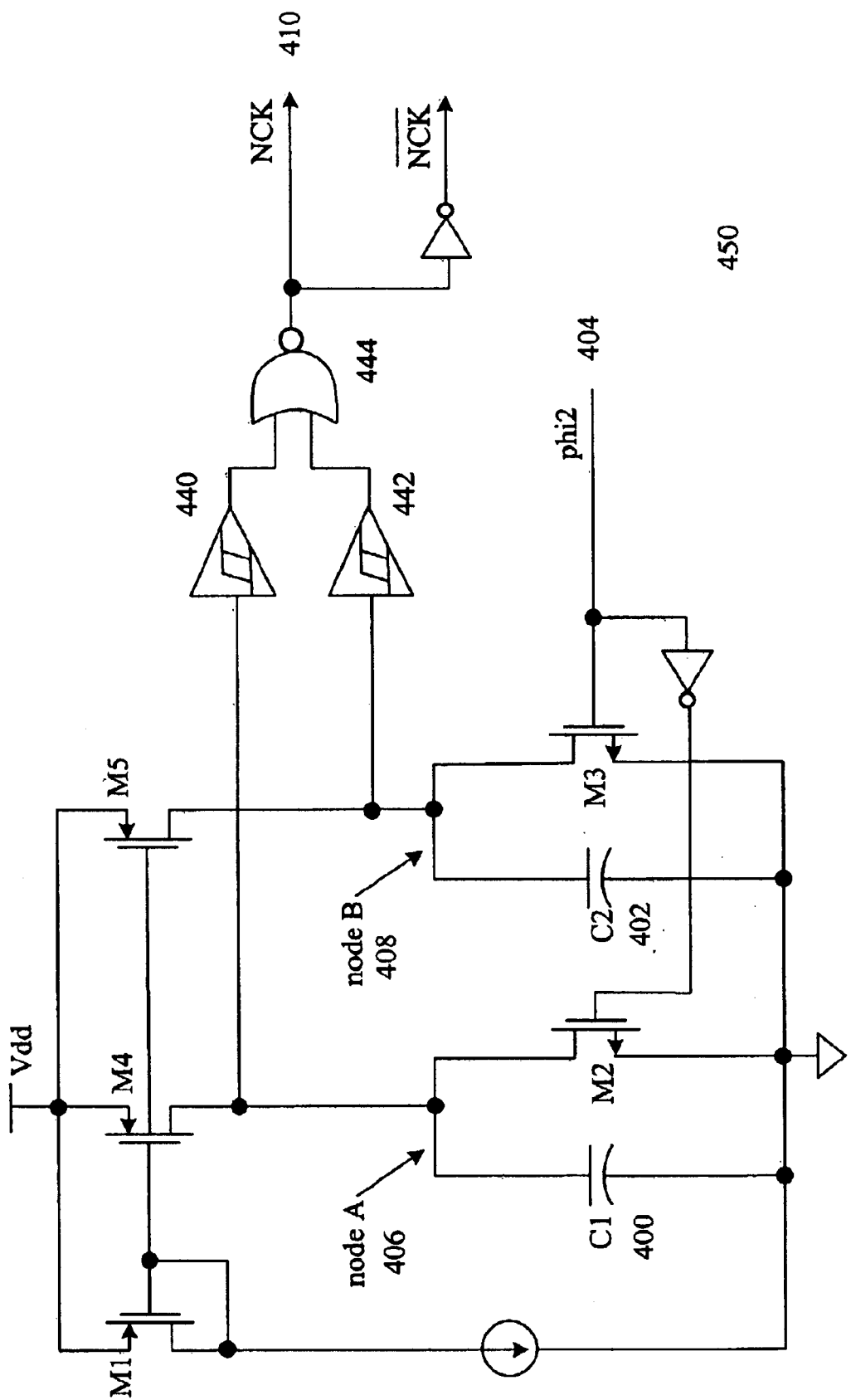
FIG. 4 schematically illustrates a clock detection circuit used by the frequency-to-current converter in embodiments of the invention.

To prevent the circuit from generating a large output current when the clock stops, embodiments of the invention also employ a clock detection circuit 450. A schematic diagram illustrating the clock detection circuit 450 is shown in FIG. 4. The clock detection circuit 450 includes a plurality of Schmidt triggers 440 442, which comprise the input to a NOR gate. Capacitors C1 400 and C2 402 are charged and discharged periodically by the clock signal phi2 404. As the clock frequency decreases, the peak voltages on node A 406 and node B 408 increase.

In embodiments of the invention, when the frequency is below a threshold frequency, the peak voltage on either node A 406 or node B 408 is high enough to trigger one of a plurality of Schmidt triggers 440 442, and the output signal NCK 410 decreases accordingly. The Schmidt triggers 440 442 bistable device used to square-up waveforms with slow rise and fall times; the operation characteristics of the Schmidt triggers 440 442 shall be apparent to those skilled in the art.

When NCK 410 is sufficiently low, the opamp op2 125 of the frequency-to-current converter 100 is tied in a voltage follower configuration, the switch SW11 160 is opened, and the output current goes to zero.

In many of the applications which may employ the frequency-to-current converter—such as, by way of non-limiting example, an Analog-to-Digital converter (ADC)—the clock frequency 200 may be variable. In such embodiments, by biasing the amplifiers with currents proportional to the clock frequency 200, the unity-gain bandwidth of the amplifiers is adaptively adjusted to track the clock frequency 200 and to save power concurrently.

Conclusion

The frequency-to-current converter described herein is particularly well suited to low power applications, of which analog-to-digital converters are one non-limiting example. The embodiments described herein are for illustrative purposes only; many equivalents and variants will be apparent to those skilled in the art.

What is claimed is:

1. An integrator circuit, wherein the integrator circuit is driven by a master clock, the integrator circuit comprising:
   an operational amplifier;
   a feedback capacitor coupled to the negative input of the operational amplifier and an output of the operational amplifier;
   a sampling capacitor coupled to the negative input of the operational amplifier, via a first switch;
   a reference voltage coupled to a positive input of the operational amplifier; and
   wherein a current output of the integrator circuit varies linearly with a clock frequency of the master clock.

2. The integrator circuit of claim 1, wherein the current output is coupled to a frequency-to-current converter.

3. The integrator circuit of claim 1, wherein the clock frequency of the master clock varies within a range of on or about 7.5 MHz to on or about 22 MHz.

4. The integrator circuit of claim 2, further comprising:
   a clock detector, the clock detector operative to disable the frequency-to-current converter when the clock halts.

5. The integrator circuit of claim 4, wherein the frequency-to-current converter is a component of an analog-to-digital converter.

6. The integrator circuit of claim 5, wherein the analog-to-digital converter has an operating voltage between 2.7 volts to 3.6 volts.

7. The integrator circuit of claim 6, wherein the analog-to-digital converter consumes under 1 mW/MSPS.

8. The integrator circuit of claim 7, wherein the analog-to-digital converter has an input frequency of on or about 22 MHz.

9. The integrator circuit of claim 4, wherein the analog-to-digital converter is in communication with a second operational amplifier, the second operational amplifier buffering a second reference voltage.

10. The integrator circuit of claim 4, wherein the output of the operational amplifier is also connected to a low-pass filter.

11. The integrator circuit of claim 4, wherein the clock detector includes a plurality of Schmidt triggers.

12. A multi-phase clock generator operative to time a frequency-to-current converter, the multi-phase clock generator comprising:
   an input from a master clock;
   a first output for a first phase of the multi-phase clock generator, the first phase comprising a reset phase for the frequency-to-current converter;
   a second output for a second phase of the multi-phase clock generator, the second phase comprising a charge phase for the frequency-to-current converter;
   a third output for a third phase, the third phase comprising a comparison phase for the frequency-to-current converter.

13. The multi-phase clock generator of claim 12, wherein a sampling capacitor in the frequency-to-current converter is shorted during the reset phase.

14. The multi-phase clock generator of claim 13, wherein the second phase a top plate for the sampling capacitor is connected to a first reference voltage in the frequency-to-current converter during the charge phase.

15. The multi-phase clock generator of claim 14, wherein an integrator circuit in the frequency-to-current converter compares a reference voltage in the frequency-to-current converter to an input voltage during the compare phase.

16. The multi-phase clock generator of claim 15, wherein the input voltage and the reference voltage are coupled to an integrator in the frequency-to-current converter.

17. The multi-phase clock generator of claim 16, wherein the input voltage and the reference voltage are coupled to an operational amplifier in the integrator.

18. A method of converting frequency-to-current in a frequency-to-current converter circuit, wherein the frequency-to-current converter circuit is driven by a varying clock frequency, the method comprising:
   receiving the variable clock frequency; and
   biasing one or more amplifiers in the frequency-to-current converter circuit with one or more currents proportional to the variable clock frequency.

19. The method of claim 18, the biasing the one or more amplifiers further comprising adjusting a unity gain bandwidth of the one or more amplifiers with the one or more currents to track the variable clock frequency.

20. The method of claim 18, wherein the frequency-to-current converter circuit is embedded in a hardware application.

21. The method of claim 20, wherein the hardware application comprises an analog-to-digital converter.

22. The method of claim 21, wherein the analog-to-digital converter operates below 1 mW/MSPS.

23. A frequency-to-current converter for converting a variable clock frequency to an output current, the frequency-to-current converter comprising:
   an integrator circuit for determining the output current;
   an input reference voltage coupled to the integrator circuit;
   a current feedback from the integrator circuit;
   a sampling capacitor receiving the current feedback; and wherein the feedback current is sufficient to discharge the sampling capacitor to a fixed voltage.

24. The frequency-to-current converter of claim 23, wherein the output current is linearly proportional to the input reference voltage.

25. The frequency-to-current converter of claim 24, wherein the output current is linearly proportional to a capacitance of the sampling capacitor.

26. The frequency-to-current converter of claim 25, wherein the output current is linearly proportional to the variable clock frequency.

27. The frequency-to-current converter of claim 23, wherein the variable clock frequency varies in a range of 7.5 MHz to 22 MHz.

28. The frequency-to-current converter of claim 23, wherein the integrator circuit further includes an operational amplifier.

29. The frequency-to-current converter of claim 24, wherein the operational amplifier receives the current feedback as input.

30. The frequency-to-current converter of claim 29, wherein an input of the operational amplifier is coupled to the sampling capacitor.

31. The frequency-to-current converter of claim 30, wherein an output of the operational amplifier is coupled to a low pass filter.

32. An analog-to-digital converter adaptive to operate at low power, the analog-to-digital converter comprising:

a master clock;

one or more analog circuit blocks operative to receive an analog input to the analog-to-digital converter;

a frequency-to-current converter supplying a current to the one or more analog circuit blocks, such that the current is proportional to the frequency of the master clock.

33. The analog-to-digital converter of claim 32, further comprising a power supply operative within a range of 2.7 volts to 3.6 volts.

34. The analog-to-digital converter of claim 32, wherein the converter is operative to consume less than 1 mW/MSPS.

35. The analog-to-digital converter of claim 32, wherein the frequency-to-current converter includes an integrator operative to ensure that the current is proportional to the frequency of the master clock.

36. The analog-to-digital converter of claim 32, wherein the converter is operative to convert eight bits.

* * * * *